United States Patent
Abdul-Hadi et al.

(10) Patent No.: US 10,571,497 B2
(45) Date of Patent: *Feb. 25, 2020

(54) ANSI ELECTRICAL MODULAR METER FOR ELECTRICITY METERS

(71) Applicant: LANDIS+GYR INNOVATIONS, INC., Alpharetta, GA (US)

(72) Inventors: Louay Abdul-Hadi, Woodstock, GA (US); Keith Mario Torpy, Sydney (AU); Nikhil Tanwani, Delhi (IN)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/905,205

(22) Filed: Feb. 26, 2018

(65) Prior Publication Data
US 2019/0265282 A1  Aug. 29, 2019

(51) Int. Cl.
G01R 22/06  (2006.01)
H05K 7/14  (2006.01)
H05K 5/03  (2006.01)
H01R 12/72  (2011.01)

(52) U.S. Cl.
CPC ............ *G01R 22/065* (2013.01); *H05K 5/03* (2013.01); *H05K 7/1427* (2013.01); *H01R 12/724* (2013.01)

(58) Field of Classification Search
None
See application file for complete search history.

(56) References Cited

U.S. PATENT DOCUMENTS

| | | | |
|---|---|---|---|
| 7,315,442 B2 * | 1/2008 | Robinson | G01R 11/04 324/156 |
| 8,379,376 B2 * | 2/2013 | Nehete | H05K 7/202 165/104.33 |
| 2004/0000900 A1 * | 1/2004 | Loy | G01R 22/065 324/142 |

FOREIGN PATENT DOCUMENTS

| | | |
|---|---|---|
| EP | 0421320 | 4/1991 |
| EP | 0913696 | 5/1999 |
| WO | 9935506 | 7/1999 |

OTHER PUBLICATIONS

U.S. Appl. No. 15/964,591, "Non Final Office Action", dated Jul. 10, 2018, 15 Pages.

(Continued)

*Primary Examiner* — Douglas X Rodriguez
(74) *Attorney, Agent, or Firm* — Kilpatrick Townsend & Stockton LLP

(57) ABSTRACT

An electricity meter assembly includes a meter and a module assembly. The meter includes a meter cavity, at least one electrical component within the meter cavity, and a module compartment having a module cavity. The module compartment is within the meter cavity and the meter cavity is isolated from the module cavity. The module assembly includes at least one supplemental board configured to supplement the at least one electrical component. The module assembly is removably positioned within the module cavity such that the module assembly is field-removable, and wherein the module assembly is hot pluggable with the meter.

19 Claims, 12 Drawing Sheets

(56) References Cited

OTHER PUBLICATIONS

"TPC New Type Modularization AMI Meter—Specification of AMI Residential Meter", Fortune Electric, at least as early as Nov. 2017, 37 pages.
U.S. Appl. No. 15/964,591, "Notice of Allowance", dated Nov. 8, 2018, 8 pages.
International Patent Application No. PCT/US2019/018862, "International Search Report and Written Opinion", dated May 29, 2019, 11 pages.

\* cited by examiner

ANSI ELECTRICAL MODULAR METER FOR ELECTRICITY METERS

FIELD OF THE INVENTION

This application relates to utility meters, and in some cases to a field-upgradable American National Standards Institute (ANSI) electricity meter.

BACKGROUND

Meters, such as electricity meters, commonly measure an amount of a resource (e.g., electricity) consumed by a customer. Electricity meters are often installed in residential settings, although they may be found in commercial or other settings as well. Once the electricity meter is installed, it is difficult to upgrade or update the components of the meter because such upgrades or updates require the meter to be uninstalled (e.g., taken down off a wall), upgraded or updated, and then reinstalled by a technician. Due to the difficulties and expense associated with upgrading or updating the electricity meter, the components of the electricity meter are only sporadically changed (if ever) and are often not kept up to date with the latest improvements in technology.

SUMMARY

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various embodiments of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

According to some examples, an electricity meter assembly includes a meter and a module assembly. In various aspects, the meter includes a meter cavity, at least one electrical component within the meter cavity, and a module compartment having a module cavity. In some cases, the module compartment is within the meter cavity and the meter cavity is isolated from the module cavity. In certain examples, the module assembly includes at least one supplemental board configured to supplement the at least one electrical component, the module assembly is removably positioned within the module cavity such that the module assembly is field-removable, and the module assembly is hot pluggable with the meter.

In certain cases, the meter is an ANSI electricity meter. In various examples, the electrical component comprises at least one of a power supply board, a processing board, a communication board, a base metrology board, or a modular modem. According to some examples, the meter includes a base assembly having a housing that defines the meter cavity. In various aspects, the housing of the base assembly further includes a base slot providing access to the module cavity of the module compartment. In certain examples, the at least one electrical component includes a plurality of electrical components within the meter cavity.

According to various examples, the module compartment is coupled to the housing of the base assembly within the meter cavity. In some aspects, the module compartment includes a hot pluggable connector in the module compartment, and the module assembly is configured to removably couple to the hot pluggable connector such that the module assembly is communicatively coupled with the meter. In certain cases, the meter further includes a cover assembly having a housing, and the housing of the cover assembly forms a seal with the housing of the base assembly such that the meter cavity is sealed. In various examples, the cover assembly includes a gasket between the housing of the cover assembly and the housing of the base assembly such that the meter cavity is sealed.

In some cases, the housing of the base assembly further includes a base slot providing access through the housing of the base assembly to the module cavity of the module compartment, and the housing of the cover assembly further includes a cover slot aligned with the base slot and providing access through the housing of the cover assembly to the base slot. In certain aspects, the cover assembly further includes a door assembly positioned within a door frame slot defined by the cover assembly. According to some cases, the door assembly includes a door frame slidably positioned within the door frame slot and a door hingedly attached to the door frame and configured to selectively cover the cover slot. In various examples, the door frame includes the cover slot configured to align with the base slot and provide access through the door frame to the base slot.

In various examples, the door frame slot defines at least one alignment groove, and the door frame further includes at least one alignment rib positionable within the alignment groove such that the door frame is slidable relative to the door frame slot. In certain examples, the door assembly forms a seal with the door frame slot. In some examples, the module assembly includes a module case defining a module case cavity, the at least one supplemental board is removably positioned within the module case cavity, the module case further includes a case flange, and the case flange is configured to abut portions of the housing of the cover assembly surrounding the cover slot such that the cover slot is sealed.

According to some examples, the supplemental board includes a processor board. In various cases, the processor board includes at least one of a base metrology board or an advanced metrology board. In certain aspects, the supplemental board includes a power board. In various aspects, the power board includes a DC power supply. In some cases, the supplemental board includes a communications board. According to various aspects, the at least one supplemental board includes a plurality of supplemental boards.

In certain cases, the module assembly further includes a module cover and a module case defining a module case cavity, where the supplemental board is within the module case cavity, and where the module cover is connected to the module case such that the supplemental board is sealed within the module case cavity. In various examples, the module case further includes a handle. In some examples, the module case further includes at least one sealing hole. According to certain aspects, the meter includes a face and a side portion, and the module assembly is removably positioned within the module cavity through a base slot defined in the side portion.

Various implementations described in the present disclosure can include additional systems, methods, features, and advantages, which cannot necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims.

BRIEF DESCRIPTION OF THE DRAWINGS

The features and components of the following figures are illustrated to emphasize the general principles of the present disclosure. Corresponding features and components throughout the figures can be designated by matching reference characters for the sake of consistency and clarity.

DETAILED DESCRIPTION

Figure 1:
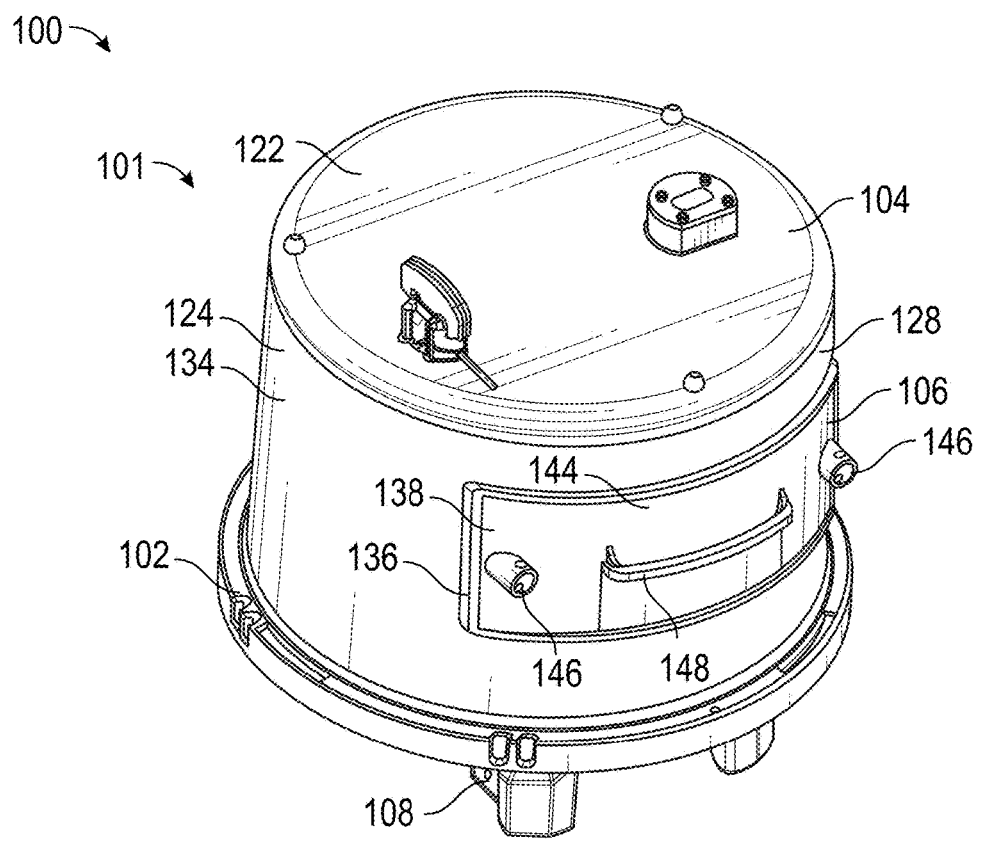
FIG. 1 is a perspective view of an electricity meter assembly including a meter and a module assembly according to aspects of the current disclosure.

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

In one aspect, disclosed is an American National Standards Institute (ANSI) socket-based meter with field-replaceable or field-removable modules and associated methods, systems, devices, and various apparatuses. The modules are hot-pluggable and may be processing modules, power supply modules, and/or communications modules, among others, such that the processing capability, communication technology, and/or power supply of the meter can be upgraded and/or changed in the field without having to uninstall the meter or cut off power to the meter.

FIGS. 1-8 illustrate an example of an electricity meter assembly 100 according to aspects of the present disclosure. The meter assembly 100 includes a meter 101 and a module assembly 106. The meter 101 includes a base assembly 102 and a cover assembly 104.

In certain examples, the meter 101 is an American National Standards Institute (ANSI) electricity meter, meaning that the meter 101 meets the standards provided by the American National Standard Institute for electricity meters, including that the meter 101 has a round profile and is designed to mount into a socket (e.g., through blades 108). The meter 101 generally includes a face 122 and side portion 124. In various examples, the side portion 124 provides access to a module compartment 116 within the meter 101 that is configured to selectively receive the module assembly 106 (see FIG. 2). In various aspects, the module assembly 106 is selectively removable from the module compartment 116 of the meter 101 such that the module assembly 106 can be changed in the field without having to uninstall the entire meter 101 or disrupt functioning of the meter 101. In other words, the module assembly 106 is "field-removable" such that the meter 101 can be upgraded wherever it is situated rather than having to uninstall the meter 101 (and disrupt functioning of the meter 101) and/or take the meter 101 to another location to be upgraded. For example, in some non-limiting cases, the module assembly 106 is selectively removable in the field to allow for a new and/or different module assembly 106 to be connected to the meter 101, which may have various combinations of boards providing changes and/or updates to the processing module of the meter 101, the power supply module of the meter 101, the communication module of the meter 101, and/or other modules of the meter 101. In addition, by providing access to the module compartment 116 through the side portion 124, the board of the module assembly 106 may be connected in parallel with other boards of the meter 101.

Figure 5:
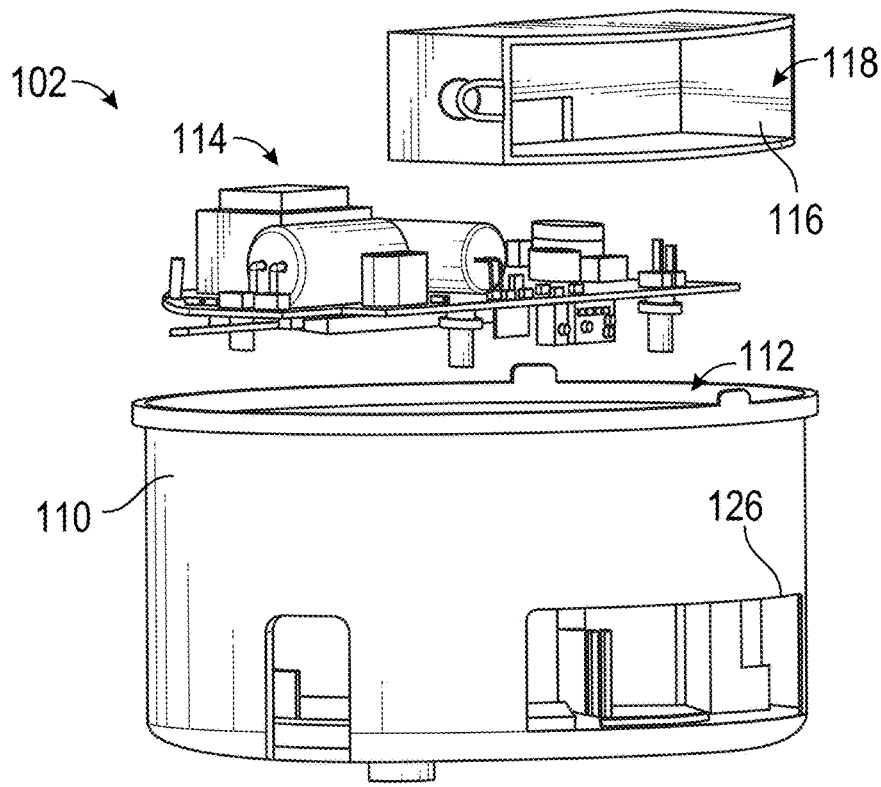
FIG. 5 is an exploded assembly view of the base assembly of FIG. 4.
Figure 6:
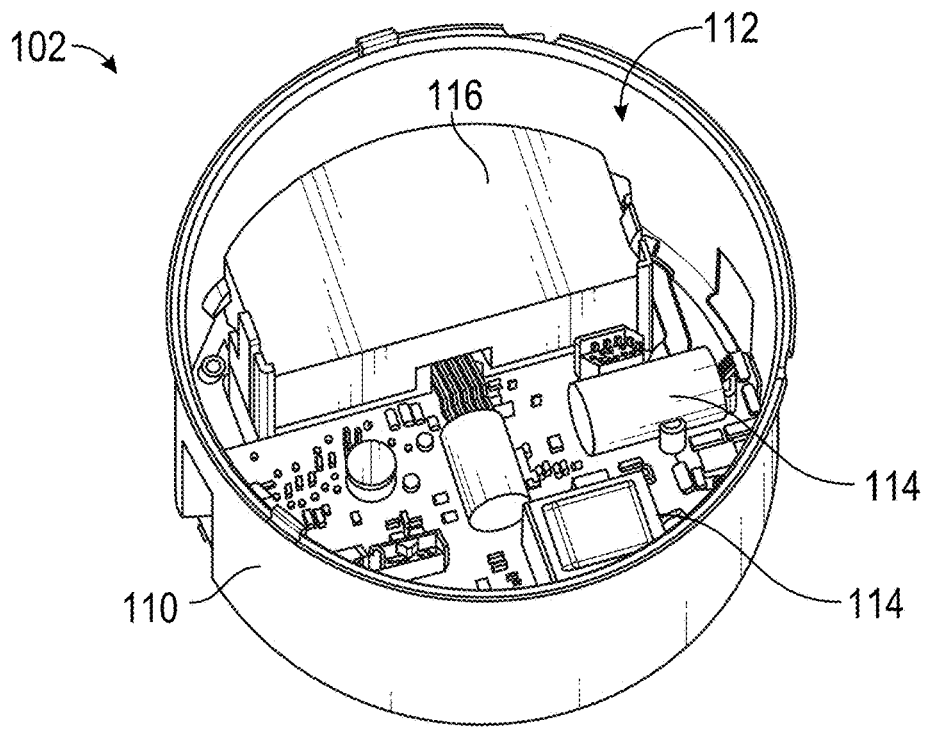
FIG. 6 is a perspective view of the base assembly of FIG. 4.

In various examples, the base assembly 102 includes a housing 110 coupled to the blades 108. As best illustrated in FIGS. 5 and 6, the housing 110 defines a meter cavity 112, and various electrical components 114 are housed within the meter cavity 112. The electrical components 114 may include a board with a power supply module, a processing module, a base metrology module, a communication module, various antennae, and/or a modular modem, among others.

In some cases, a module compartment 116 is also provided within the meter cavity 112, and a base slot 126 defined in the housing 110 provides access to the module compartment 116 through the housing 110. In various examples, the module compartment 116 is secured within the meter cavity 112 through a snap-fit connection, screws, pins, bolts, or various other securing mechanisms. As illustrated in FIG. 5, the module compartment 116 defines a module cavity 118. The module cavity 118 is isolated from the meter cavity 112 (e.g., the module cavity 118 is physically separated from the meter cavity 112) such that access to the meter cavity 112 from the module cavity 118 is restricted to various power connections and circuitry. The module compartment 116 includes a connector 120 (see, e.g., FIG. 3) that couples with the module assembly 106 when the module assembly 106 is inserted into the module compartment 116. As described in detail below, in certain examples, the module assembly 106 is hot pluggable with the meter 101 via the module compartment 116.

Figure 4:
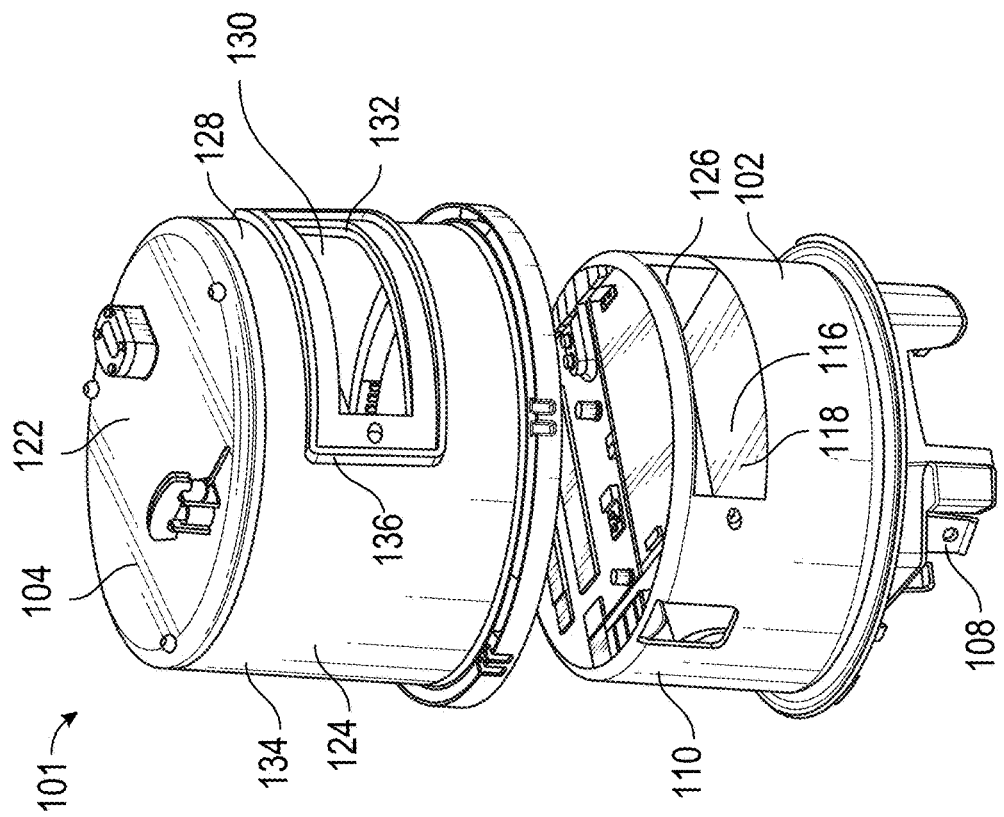
FIG. 4 is a partially exploded assembly view of the meter of FIG. 1 with a cover assembly removed from a base assembly.
Figure 3:
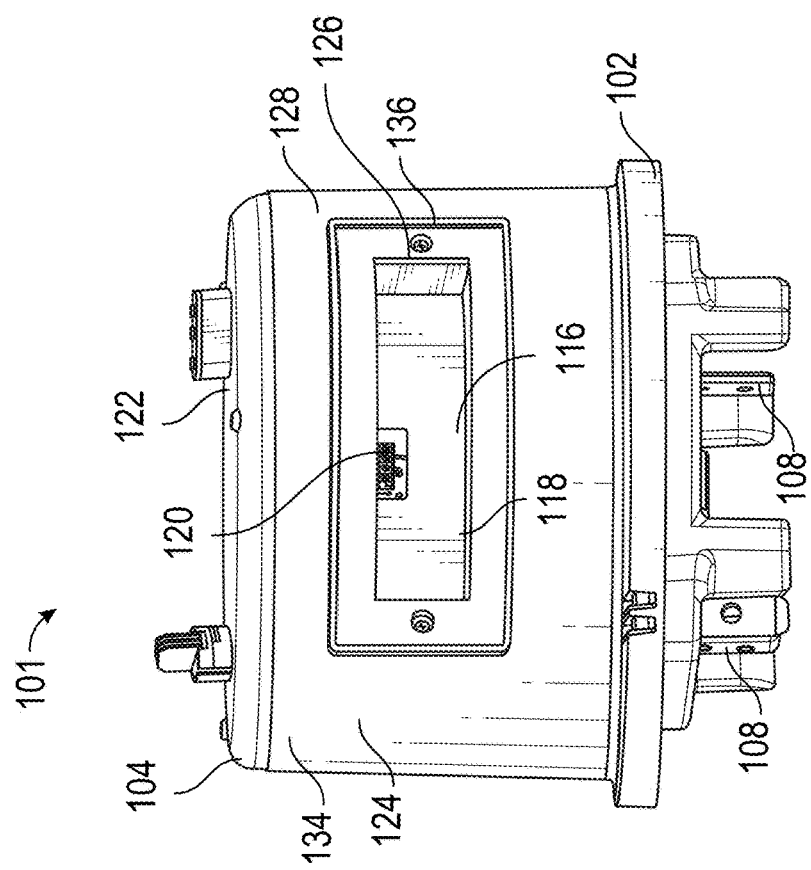
FIG. 3 is a perspective view of the meter of FIG. 1.

The cover assembly 104 of the meter 101 includes a housing 128 that defines a cover cavity 130 (see, e.g., FIG. 4). In various examples, the base assembly 102 is positionable within the cover cavity 130. In some examples, the cover assembly 104 forms a seal with the base assembly 102 through a gasket or various other similar mechanism when the base assembly 102 is positioned within the cover cavity 130. As best illustrated in FIGS. 2 and 4, the cover assembly 104 includes a cover slot 132 that aligns with the base slot 126 when the cover assembly 104 is positioned on the base assembly 102 to provides access to the module compartment 116 through the housing 110 of the base assembly 102 and through the housing 128 of the cover assembly 104. In certain examples, the module assembly 106 is insertable into the module compartment 116 through the base slot 126 and the cover slot 132. Optionally, a portion of the module assembly 106 abuts an outer surface 134 of the housing 128 when the module assembly 106 is positioned in the module compartment 116 (see, e.g., FIGS. 1 and 2).

Optionally, the cover assembly 104 includes an alignment ridge 136 on the outer surface 134 for facilitating alignment and positioning of the module assembly 106 within the module compartment 116. In some examples, the alignment ridge 136 extends around a perimeter of the cover slot 132, while in other examples, the alignment ridge 136 may only extend around a portion of the perimeter of the cover slot 132. In other examples, the alignment ridge 136 may be omitted.

Figure 7:
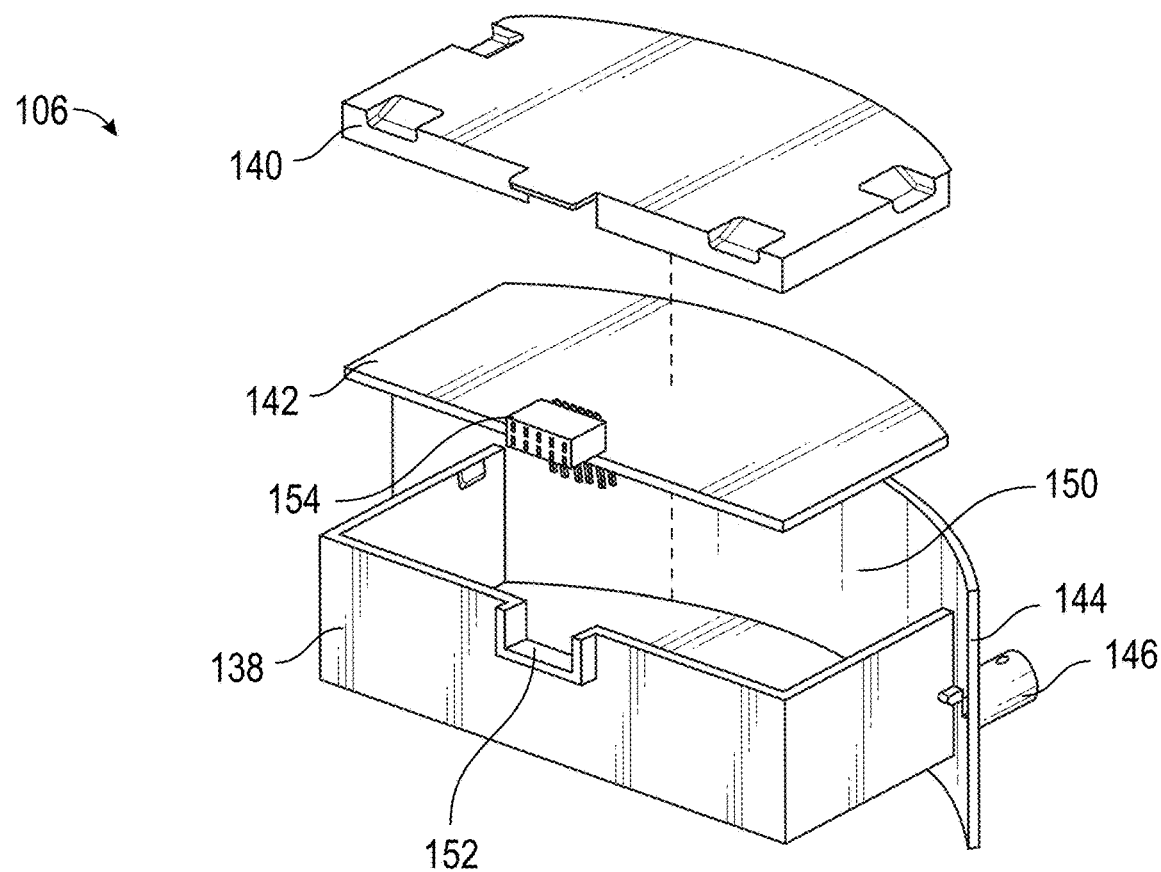
FIG. 7 is an exploded assembly view of the module assembly of FIG. 2.
Figure 8:
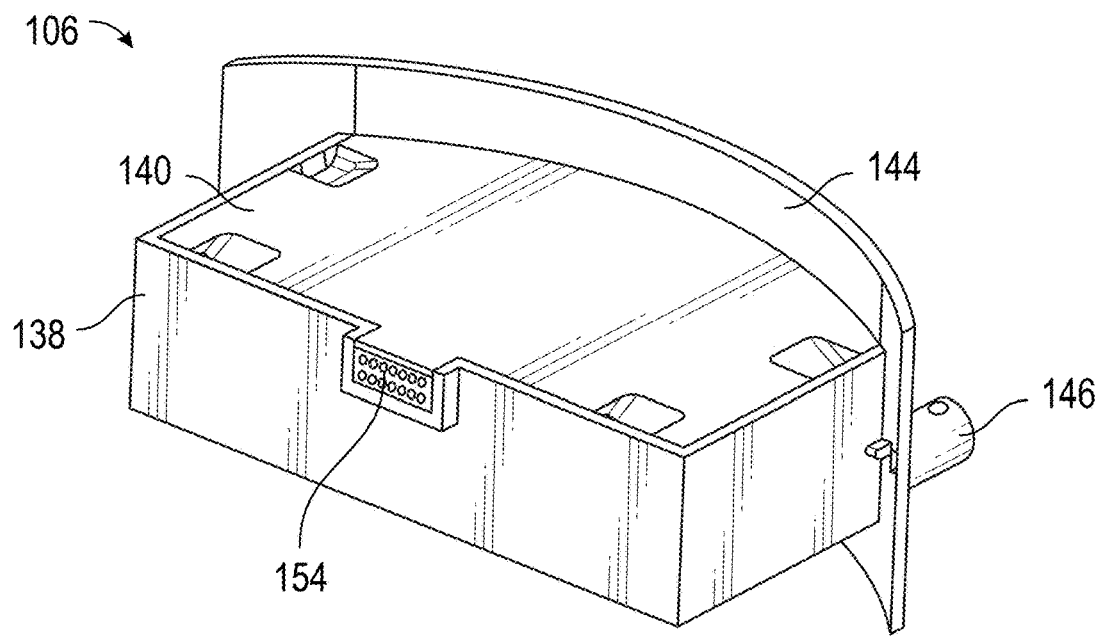
FIG. 8 is a perspective view of the module assembly of FIG. 2.
Figure 9:
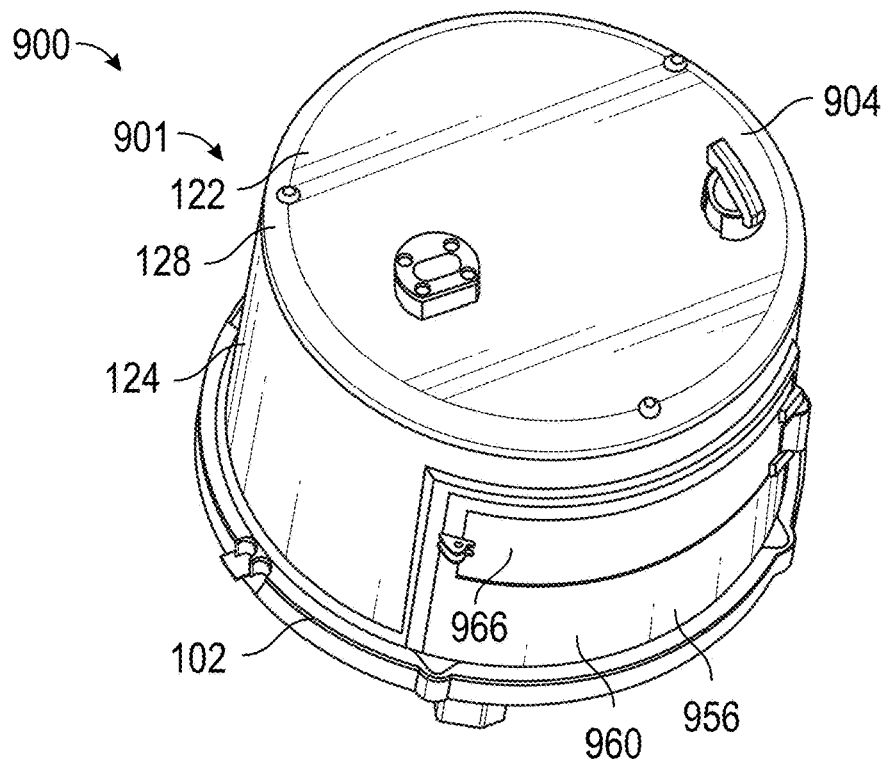
FIG. 9 is a perspective view of an electricity meter assembly including a meter and a module assembly according to aspects of the current disclosure.
Figure 10:
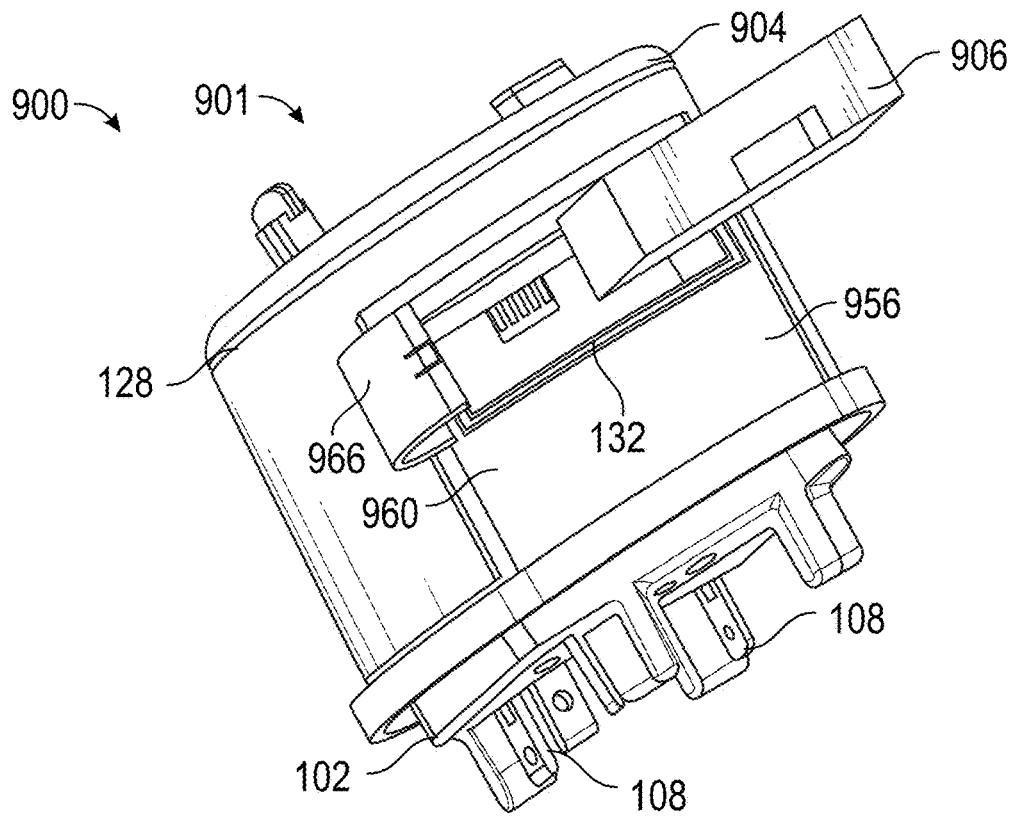
FIG. 10 is a partially exploded assembly view of the meter assembly of FIG. 1 with a module assembly removed from the meter.
Figure 12:
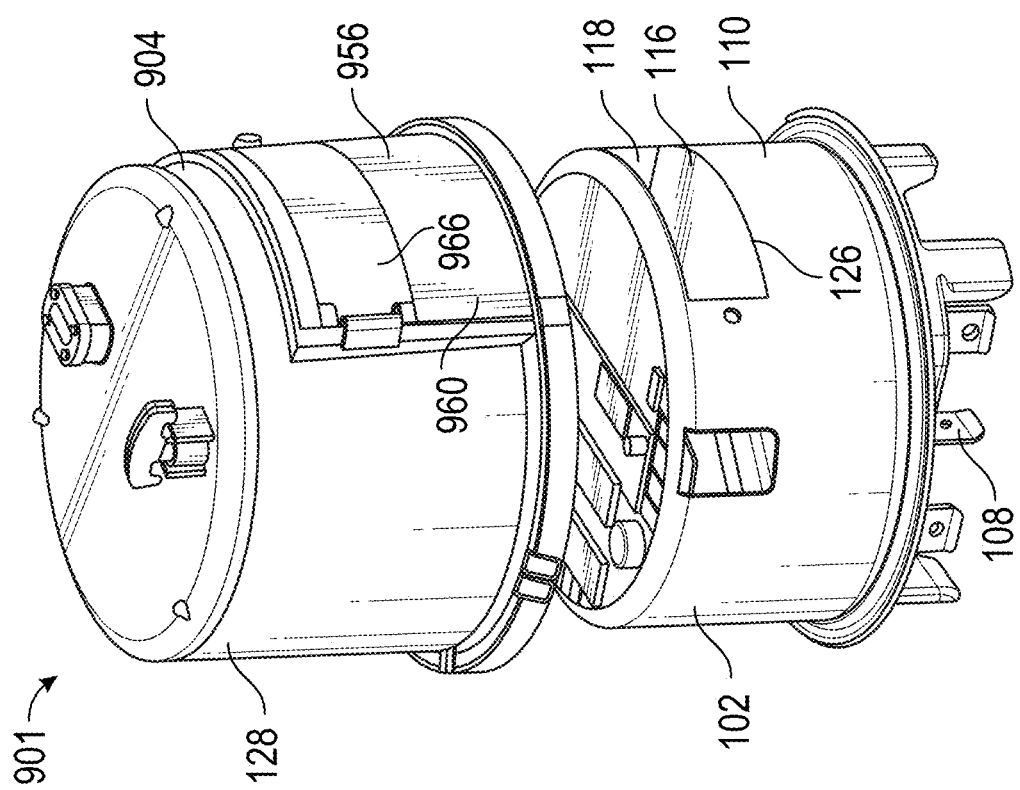
FIG. 12 is a partially exploded assembly view of the meter of FIG. 9 with a cover assembly removed from a base assembly.
Figure 11:
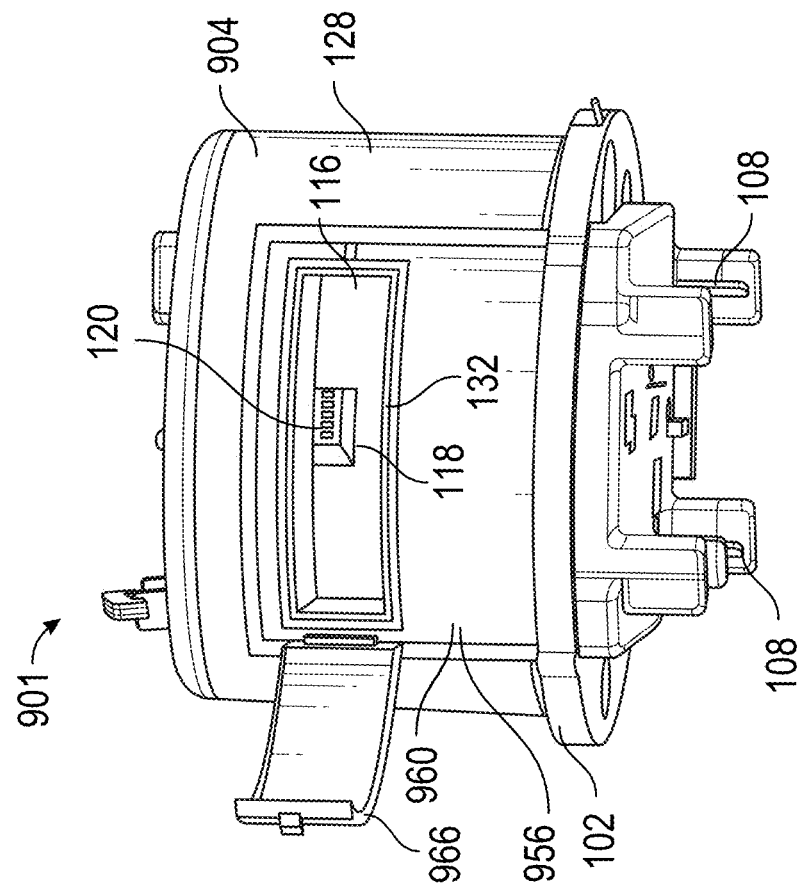
FIG. 11 is a perspective view of the meter of FIG. 9.
Figure 13:
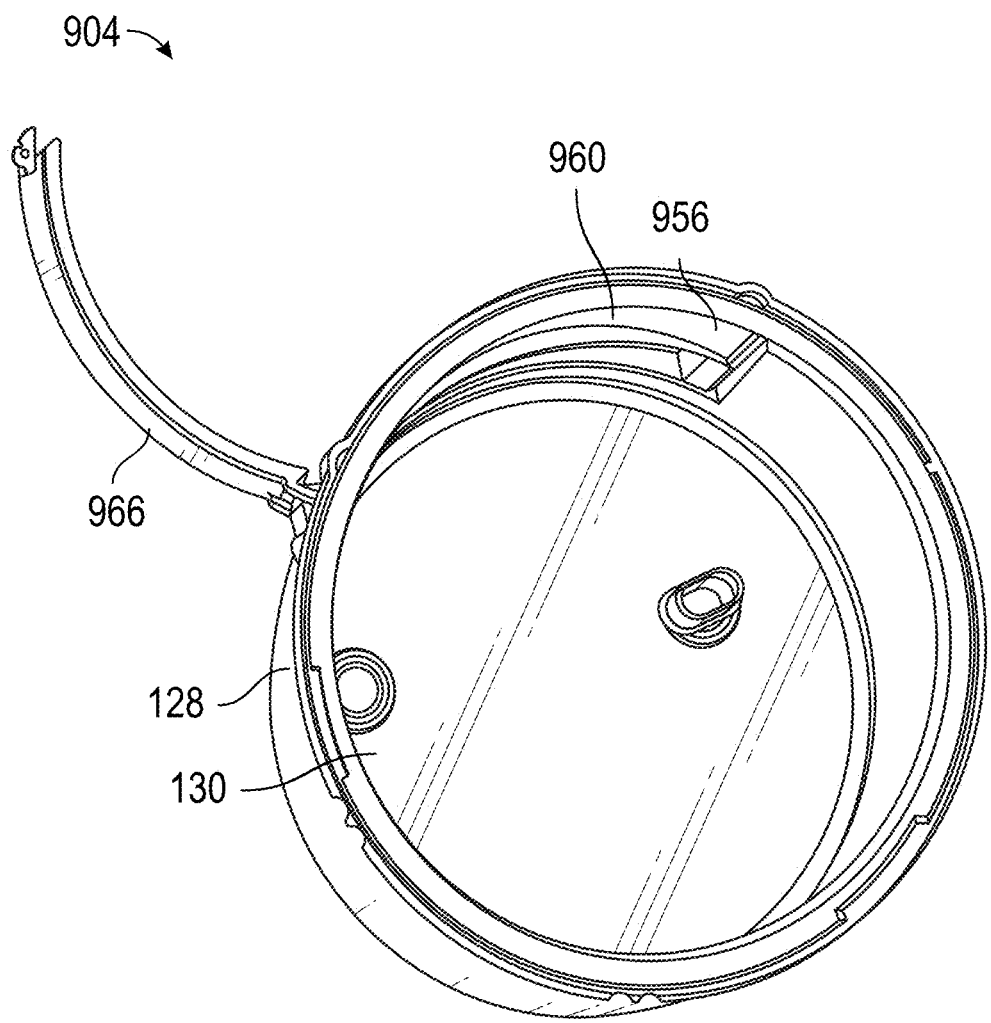
FIG. 13 is a perspective view of the cover assembly of FIG. 12.

Referring to FIGS. 2, 7, and 8, the module assembly 106 includes a case 138, a cover 140, and module with at least one printed circuit board (PCB) 142 (see FIG. 7). As described below, the at least one PCB 142 is a supplemental board configured to supplement at least one function provided by the electrical components 114 by replacing some functional aspect of the electrical component 114, upgrading the functions provided by the electrical component 114, providing additional functionality to the electrical component 114, etc.

Figure 2:
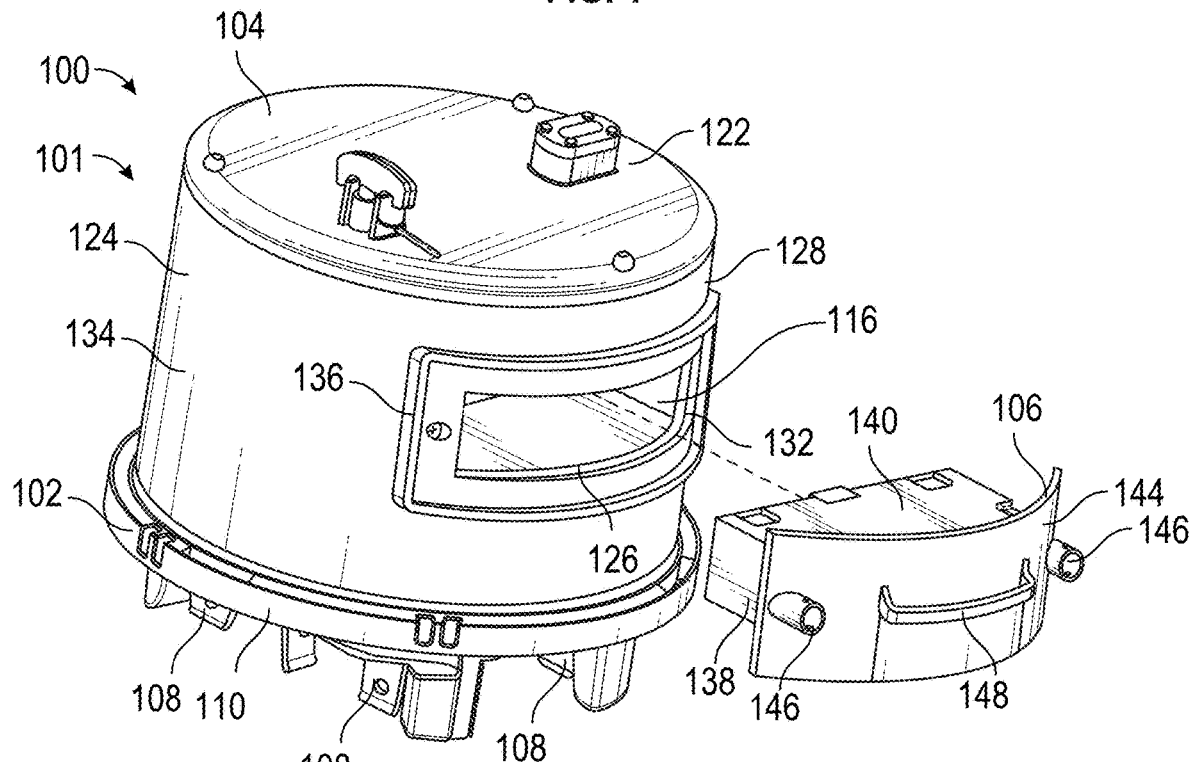
FIG. 2 is a partially exploded assembly view of the meter assembly of FIG. 1 with the module assembly removed from the meter.

In some examples, the case 138 optionally includes an alignment flange 144 that abuts the alignment ridge 136 of the cover assembly 104 to align and position the module assembly 106 (see FIGS. 1 and 2). In other examples, the alignment flange 144 may be omitted. Optionally, the case 138 may also include sealing holes 146, and handle 148, and/or various other features that may aid in positioning the module assembly 106 within the module compartment 116.

As illustrated in FIG. 7, the case 138 defines a case cavity 150, and the at least one PCB 142 is positioned within the case cavity 150 between the case 138 and the cover 140 such that the at least one PCB 142 is sealed within the case cavity 150. In some examples, the case 138 includes an opening 152 that receives a connector 154 of the at least one PCB 142 (see FIG. 8) that is connectable with the connector 120 of the module compartment 116.

While one PCB 142 is illustrated in FIG. 7, in various other examples, any number of PCBs 142 may be provided with the module assembly 106. In various examples, the at least one PCB 142 is a supplemental board that is a processing board (separate from any processing board within the meter cavity 112) for base metrology or advanced metrology, a power supply board (separate from any power supply within the meter cavity 112), a communications board (separate from any communications within the meter cavity 112), various other boards for upgrading or changing the capabilities of the meter 101 in the field, or any combination thereof. As one non-limiting example, in some aspects, the at least one PCB 142 may include a DC power supply that may expand the power supply options of the meter 101. As another non-limiting example, the at least one PCB 142 may include a processor board that supports webservices and/or computational applications on demand and as needed by the meter 101. As a further non-limiting example, the at least one PCB 142 may be a communications board with various communications technologies (e.g., RF, cellular, etc.) that may be different from or supplemental to the communications of the meter 101.

As mentioned previously, in certain examples, the module assembly 106 is hot pluggable (also called hot swappable) with the meter 101 such that the module assembly 106 can be installed and removed from the meter 101 as needed or desired without significant interruption to the operation of the meter 101 and without requiring special tools. In certain examples, to make the meter assembly 100 hot pluggable, the meter 101 and/or the module assembly 106 may include certain features provided below. It will be appreciated that additional, fewer, or alternative features may be provided with the meter 101 and/or the module assembly 106 to make the meter assembly 100 hot pluggable. In some examples, to make the meter assembly 100 hot pluggable, the module assembly 106 may only receive low voltage from a power supply of the meter 101. In certain examples, to make the meter assembly 100 hot pluggable, the module assembly 106 is not connected to the mains level voltage of the meter 101. In various aspects, to make the meter assembly 100 hot pluggable, the connector 120 has concealed pins and the connector 154 has exposed pins (or vice versa), and the connectors 120 and 154 are connectable in the module compartment 116 that has restricted access. In some cases, to make the meter assembly 100 hot pluggable, the power supply to the module assembly 106 is electrically isolated from the power supply to the meter 101, and power output to the module assembly 106 is protected against a short circuit to allow for the meter 101 to continue running if the connector pins of the module assembly 106 are shorted. In various cases, to make the meter assembly 100 hot pluggable, the module compartment 116 and the case 138 provide blind mating functionality. As previously described, in certain aspects, to make the meter assembly 100 hot pluggable, the module compartment 11 is fully enclosed and isolated to limit access to power connections and circuitry. In various examples, all signals (e.g., communications, I/O, etc.) between the meter 101 and the module assembly 106 use optical isolators. In certain examples, to make the meter assembly 100 hot pluggable, the connector 154 of the module assembly 106 includes a make first, break last ground connection to the meter 101.

A method of assembling the meter 101 is also provided. In various examples, the method includes providing the base assembly 102 having the electrical components 114 and module compartment 116. The method includes positioning the base assembly 102 within the cover cavity 130 of the cover assembly 104 such that the cover slot 132 of the cover assembly 104 is aligned with the base slot 126 of the base assembly 102. In various examples, positioning the base assembly 102 within the cover cavity 130 includes forming a seal between the cover assembly 104 and the base assembly 102. In some examples, the method includes positioning the module assembly 106 within the module compartment 116 by positioning the module assembly 106 through the aligned base slot 126 and the cover slot 132. In various aspects, the module assembly 106 is hot pluggable with the meter 101 through the module compartment 116, and positioning the module assembly 106 in the module compartment 116 includes establishing a connection between the module assembly 106 and the meter 101 (via connectors 120 and 154) without significantly interrupting operation of the meter 101. In some cases, the method includes installing the meter 101 on a meter socket by mating the blades 108 with the meter socket either before or after the module assembly 106 is positioned within the module compartment 116.

In various examples, the method includes upgrading or changing the module assembly 106 in the field without uninstalling the meter 101 or significantly interrupting operation of the meter 101 and/or without requiring special tooling. Changing the module assembly 106 includes removing the existing module assembly 106 from the module compartment 116 without interrupting operation of the meter 101, selecting the desired module assembly 106 having the desired module upgrade or change, and inserting the desired module assembly 106 into the module compartment 116 such that the desired module assembly 106 provides the desired module upgrade or change to the meter 101. In some examples, the desired module assembly 106 includes the at least one PCB 142 having at least one of an upgraded or different processing board for base metrology or advanced metrology, power supply board, and/or communications board different from a board within the meter 101.

FIGS. 9-18 illustrate another example of a meter assembly 900 according to aspects of the present disclosure. The meter assembly 900 is substantially similar to the meter assembly 100 except that the meter 901 of the meter assembly 900 includes a cover assembly 904 having a door assembly 956. The meter assembly 900 also includes a module assembly 906 without the alignment flange 144.

Figure 14:
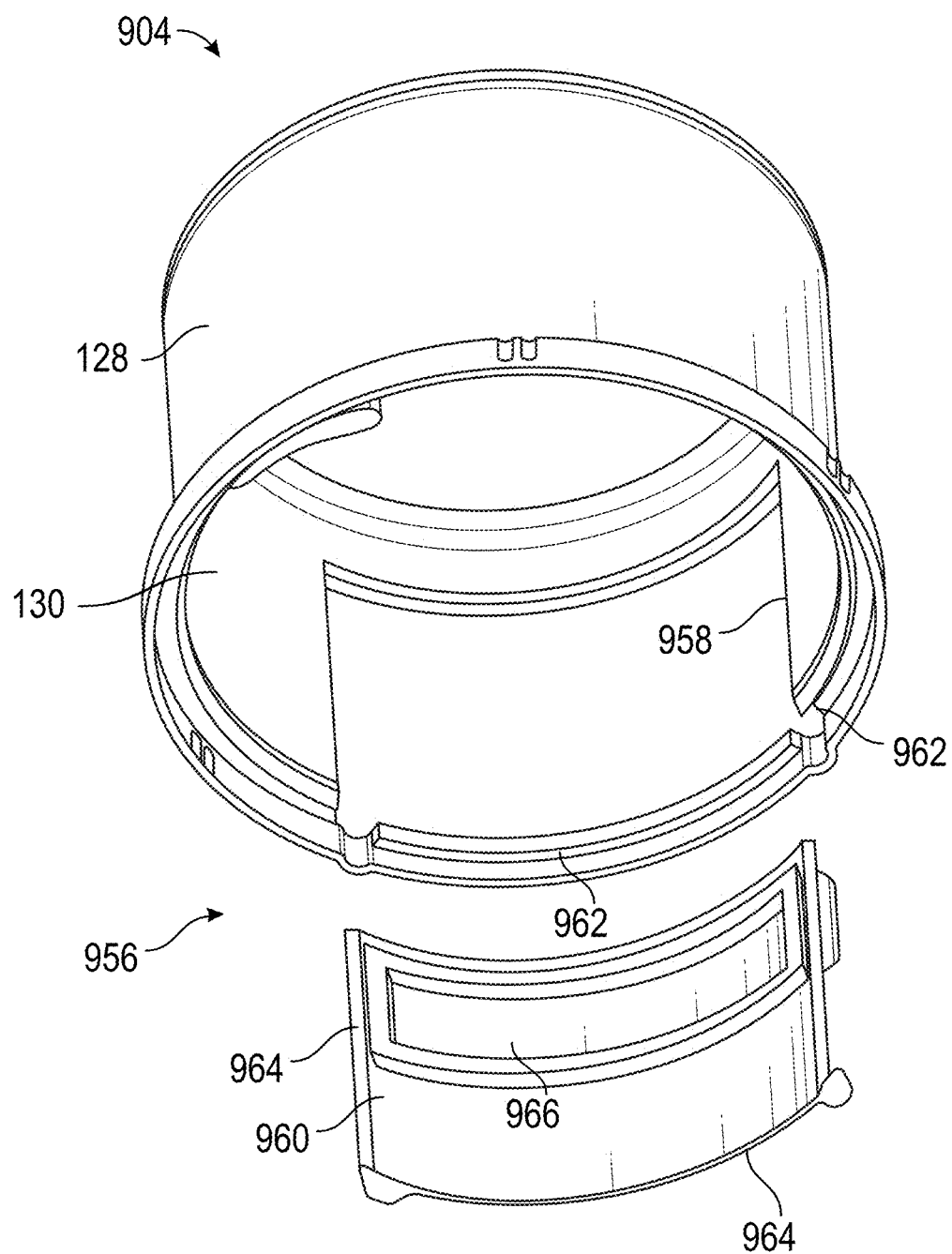
FIG. 14 is a partially exploded assembly view of the cover assembly of FIG. 12 with a door assembly.
Figure 15:
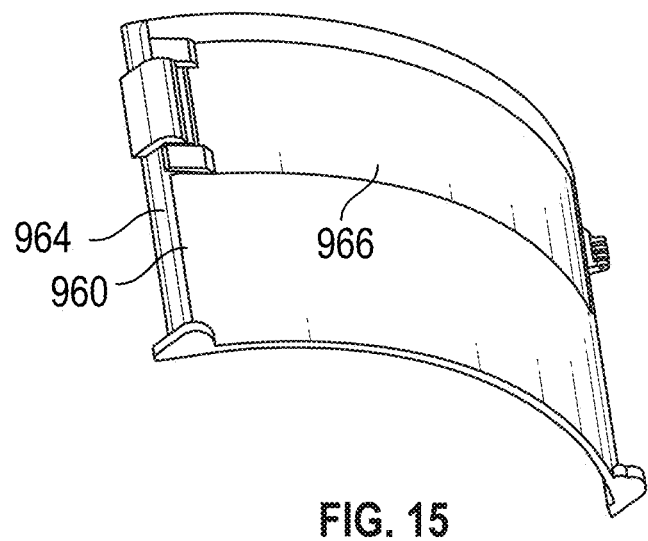
FIG. 15 is a perspective view of the door assembly of FIG. 14.
Figure 16:
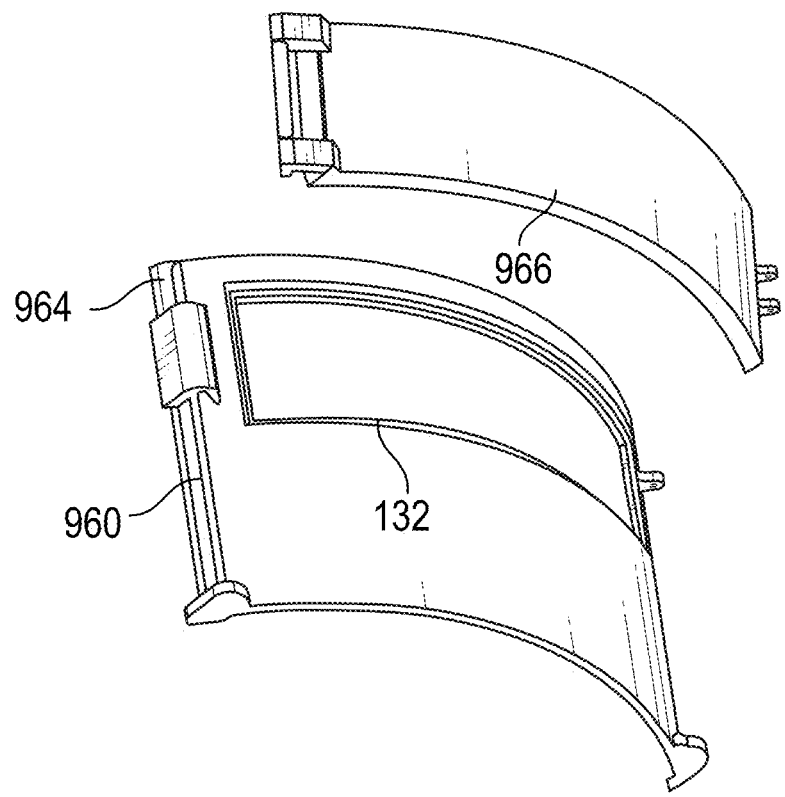
FIG. 16 is an exploded assembly view of the door assembly of FIG. 14.
Figure 17:
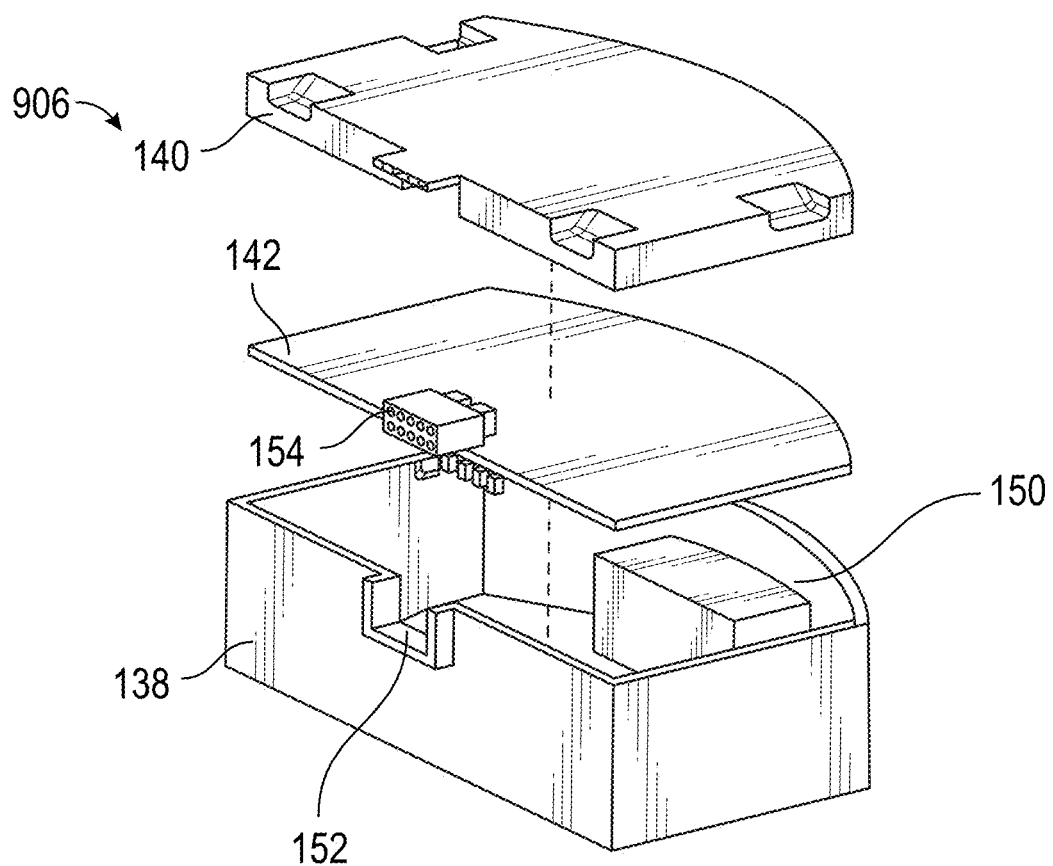
FIG. 17 is an exploded assembly view of the module assembly of FIG. 10.
Figure 18:
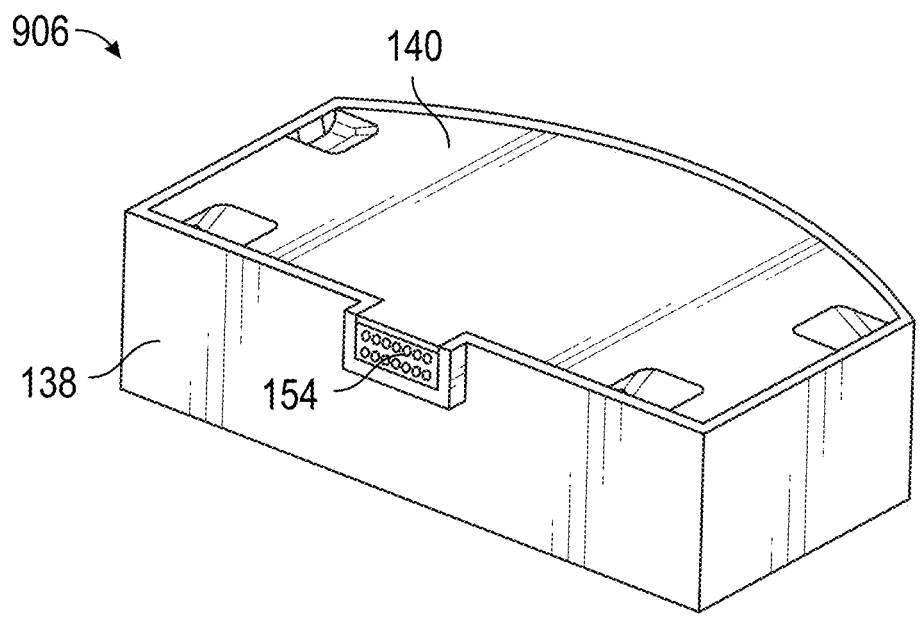
FIG. 18 is a perspective view of the module assembly of FIG. 10.

As best illustrated in FIG. 14, the cover assembly 904 includes a door frame slot 958 for receiving a door frame 960 of the door assembly 956. In various examples, the door frame 960 is slidably positioned within the door frame slot 958. Optionally, the door frame slot 958 includes grooves 962 that engage with alignment ribs 964 of the door frame 960 to position and align the door frame 960 within the door frame slot 958. In some examples, the grooves 962 may extend around a perimeter of the door frame slot 958, although they need not in other examples. Similarly, the alignment ribs 964 may extend around a perimeter of the door frame 960, although they need not in other examples.

The door frame 960 defines the cover slot 132. A door 966 is hingedly attached to the door frame 960 and selectively covers the cover slot 132. Compared to the module assembly 106, the module assembly 906 is completely housed within the meter 901 when the door 966 of the door assembly 956 covers the cover slot 132 (e.g., the module assembly 906 is not exposed and/or directly accessible from outside the meter 901) (see FIG. 9).

Figure 19:
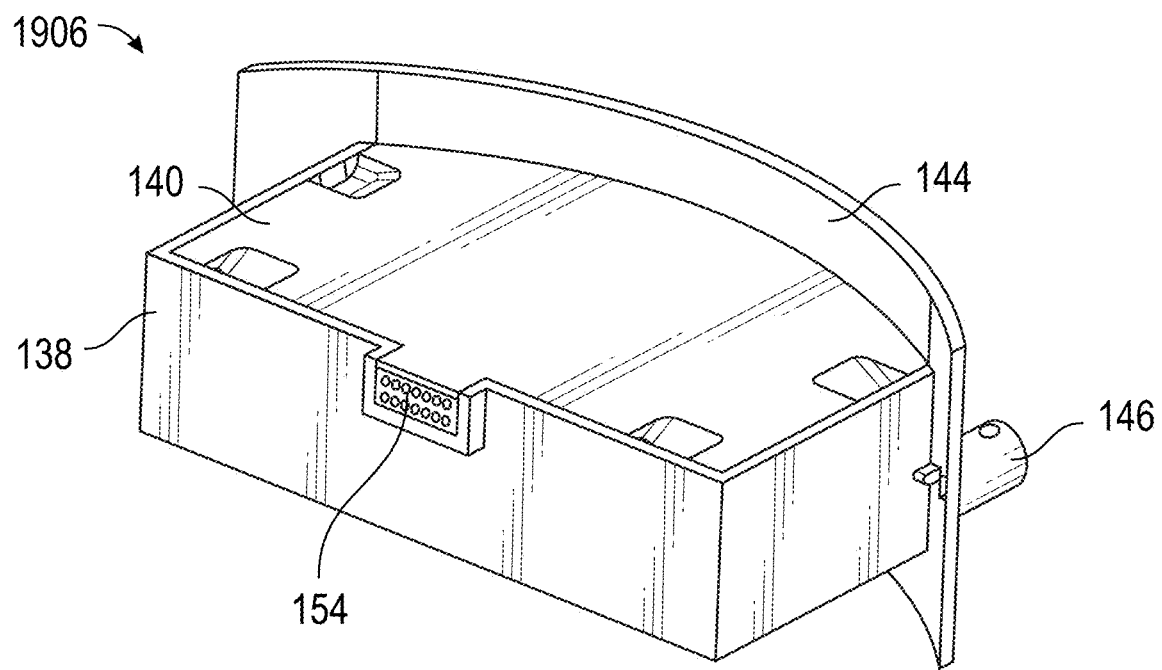
FIG. 19 is a perspective view of the module assembly according to aspects of the current disclosure.
Figure 20:
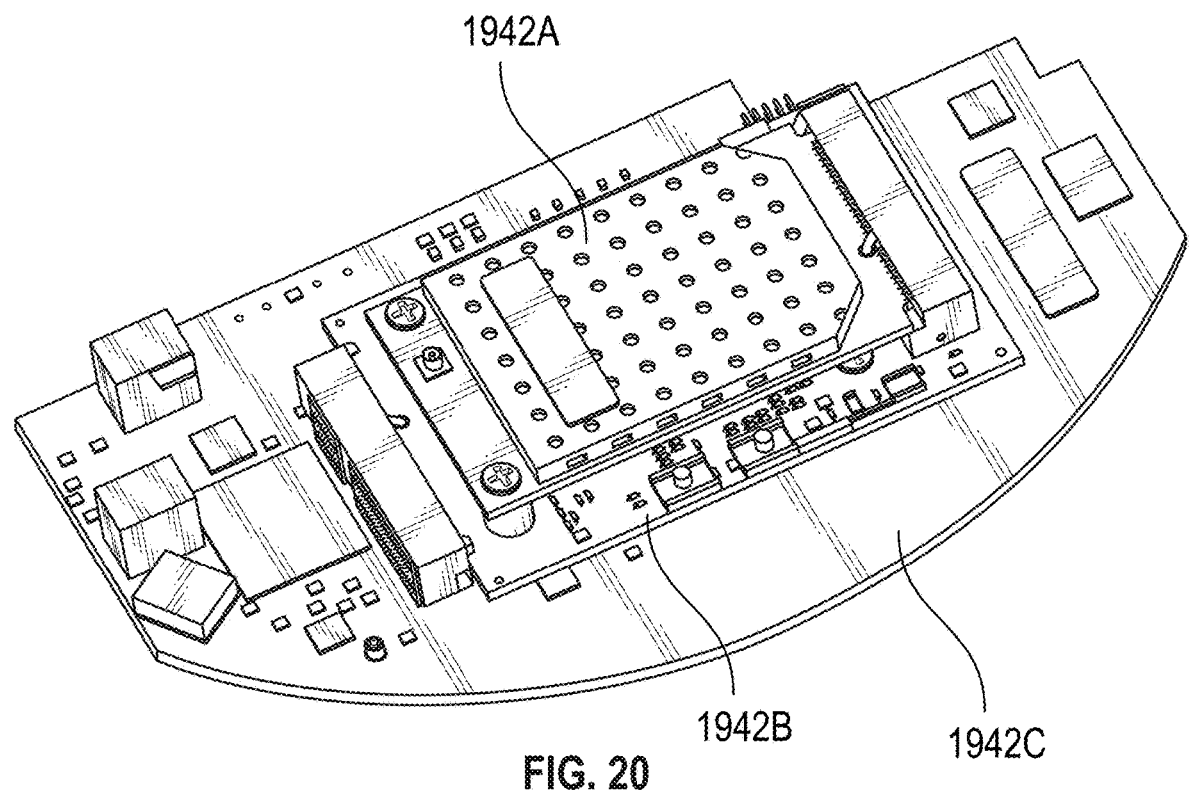
FIG. 20 is a perspective view of a printed circuit board of the module assembly of FIG. 19.
Figure 21:
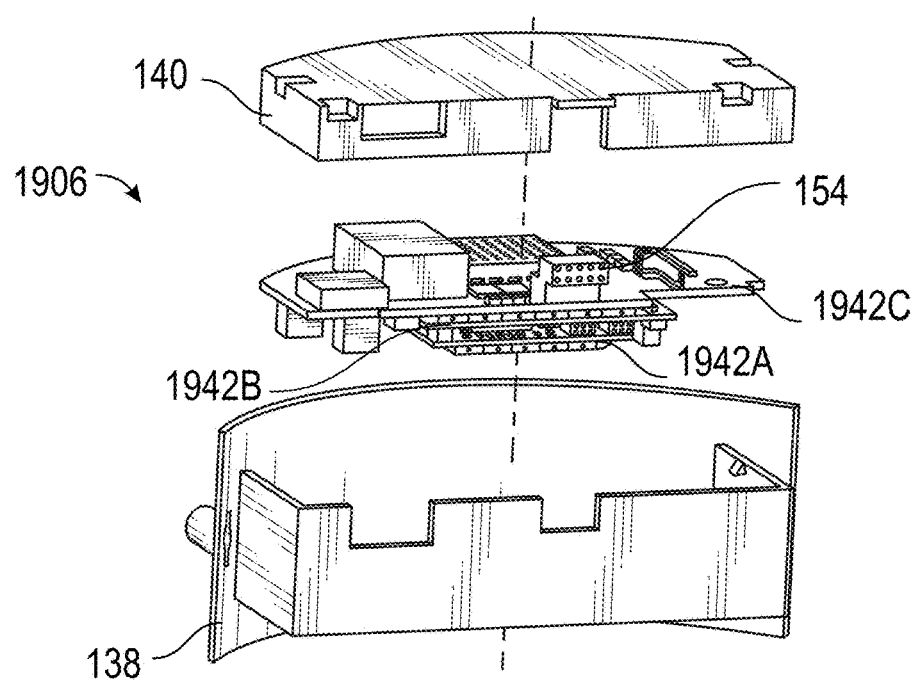
FIG. 21 is an exploded assembly view of the module assembly of FIG. 19.

FIGS. 19-21 illustrate another example of a module assembly 1906 according to aspects of the present disclosure. Similar to the module assemblies 106 and 906, the module assembly 1906 includes a case 138, a cover 140, and a module with at least PCB 1942 (see FIG. 20). In some examples, the case 138 of the module assembly 1906 is substantially similar to the case 138 of the module assembly 106; however, in other examples, the case 138 may be substantially similar to the case 138 of the module assembly 906 or may have any other shape as desired.

As illustrated in FIG. 20, the module of the module assembly 1906 includes a PCB stack (i.e., a plurality of PCBs 1942). In some examples, the PCB stack includes a communication module PCB 1942A, a processing module PCB 1942B, and a power supply and/or ZigBee module PCB 1942C. As previously described, in various examples, additional, fewer, and/or alternative PCBs 1942 may be provided with the PCB stack to to supplement at least one function provided by the electrical components of a meter by replacing some functional aspect of the electrical component, upgrading the functions provided by the electrical component, providing additional functionality to the electrical component, etc.

A collection of exemplary embodiments, including at least some explicitly enumerated as "ECs" (Example Combinations), providing additional description of a variety of embodiment types in accordance with the concepts described herein are provided below. These examples are not meant to be mutually exclusive, exhaustive, or restrictive; and the invention is not limited to these example embodiments but rather encompasses all possible modifications and variations within the scope of the issued claims and their equivalents.

EC 1. An electricity meter assembly comprising: a meter comprising: a meter cavity; at least one electrical component within the meter cavity; and a module compartment comprising a module cavity, wherein module compartment is within the meter cavity and wherein the meter cavity is isolated from the module cavity; and a module assembly comprising at least one supplemental board configured to supplement the at least one electrical component, wherein the module assembly is removably positioned within the module cavity such that the module assembly is field-removable, and wherein the module assembly is hot pluggable with the meter.

EC 2. The electricity meter assembly of any of the preceding or subsequent example combinations, wherein the meter is an ANSI meter.

EC 3. The electricity meter assembly of any of the preceding or subsequent example combinations, wherein the electrical component comprises at least one of a power supply board, a processing board, a communication board, a base metrology board, or a modular modem.

EC 4. The electricity meter assembly of any of the preceding or subsequent example combinations, wherein the meter comprises a base assembly comprising a housing, and wherein the housing defines the meter cavity.

EC 5. The electricity meter assembly of any of the preceding or subsequent example combinations, wherein the housing of the base assembly further comprises a base slot providing access to the module cavity of the module compartment.

EC 6. The electricity meter assembly of any of the preceding or subsequent example combinations, wherein the at least one electrical component comprises a plurality of electrical components within the meter cavity.

EC 7. The electricity meter assembly of any of the preceding or subsequent example combinations, wherein the module compartment is coupled to the housing of the base assembly within the meter cavity.

EC 8. The electricity meter assembly of any of the preceding or subsequent example combinations, wherein the module compartment comprises a hot pluggable connector in the module compartment, and wherein the module assembly is configured to removably couple to the hot pluggable connector such that the module assembly is communicatively coupled with the meter.

EC 9. The electricity meter assembly of any of the preceding or subsequent example combinations, wherein the meter further comprises a cover assembly comprising a housing, and wherein the housing of the cover assembly forms a seal with the housing of the base assembly such that the meter cavity is sealed.

EC 10. The electricity meter assembly of any of the preceding or subsequent example combinations, wherein the cover assembly comprises a gasket between the housing of the cover assembly and the housing of the base assembly such that the meter cavity is sealed.

EC 11. The electricity meter assembly of any of the preceding or subsequent example combinations, wherein the housing of the base assembly further comprises a base slot providing access through the housing of the base assembly to the module cavity of the module compartment, wherein the housing of the cover assembly further comprises a cover slot aligned with the base slot and providing access through the housing of the cover assembly to the base slot.

EC 12. The electricity meter assembly of any of the preceding or subsequent example combinations, wherein the cover assembly further comprises a door assembly positioned within a door frame slot defined by the cover assembly.

EC 13. The electricity meter assembly of any of the preceding or subsequent example combinations, wherein the door assembly comprises: a door frame slidably positioned within the door frame slot, wherein the door frame comprises the cover slot configured to align with the base slot and provide access through the door frame to the base slot; and a door hingedly attached to the door frame and configured to selectively cover the cover slot.

EC 14. The electricity meter assembly of any of the preceding or subsequent example combinations, wherein the door frame slot defines at least one alignment groove, and wherein the door frame further comprises at least one alignment rib positionable within the alignment groove such that the door frame is slidable relative to the door frame slot.

EC 15. The electricity meter assembly of any of the preceding or subsequent example combinations, wherein the door assembly forms a seal with the door frame slot.

EC 16. The electricity meter assembly of any of the preceding or subsequent example combinations, wherein the module assembly comprises a module case defining a module case cavity, wherein the at least one supplemental board is removably positioned within the module case cavity, wherein the module case further comprises a case flange, and wherein the case flange is configured to abut portions of the housing of the cover assembly surrounding the cover slot such that the cover slot is sealed.

EC 17. The electricity meter assembly of any of the preceding or subsequent example combinations, wherein the supplemental board comprises a processor board.

EC 18. The electricity meter assembly of any of the preceding or subsequent example combinations, wherein the processor board comprises at least one of a base metrology board or an advanced metrology board.

EC 19. The electricity meter assembly of any of the preceding or subsequent example combinations, wherein the supplemental board comprises a power board.

EC 20. The electricity meter assembly of any of the preceding or subsequent example combinations, wherein the power board comprises a DC power supply.

EC 21. The electricity meter assembly of any of the preceding or subsequent example combinations, wherein the supplemental board comprises a communications board.

EC 22. The electricity meter assembly of any of the preceding or subsequent example combinations, wherein the at least one supplemental board comprises a plurality of supplemental boards.

EC 23. The electricity meter assembly of any of the preceding or subsequent example combinations, wherein the module assembly further comprises a module cover and a module case defining a module case cavity, wherein the supplemental board is within the module case cavity, and wherein the module cover is connected to the module case such that the supplemental board is sealed within the module case cavity.

EC 24. The electricity meter assembly of any of the preceding or subsequent example combinations, wherein the module case further comprises a handle.

EC 25. The electricity meter assembly of any of the preceding or subsequent example combinations, wherein the module case further comprises at least one sealing hole.

EC 26. The electricity meter assembly of claim 1, wherein the meter comprises a face and a side portion, and wherein the module assembly is removably positioned within the module cavity through a base slot defined in the side portion.

It should be emphasized that the above-described aspects are merely possible examples of implementations, merely set forth for a clear understanding of the principles of the present disclosure. Many variations and modifications can be made to the above-described embodiment(s) without departing substantially from the spirit and principles of the present disclosure. All such modifications and variations are intended to be included herein within the scope of the present disclosure, and all possible claims to individual aspects or combinations of elements or steps are intended to be supported by the present disclosure. Moreover, although specific terms are employed herein, as well as in the claims that follow, they are used only in a generic and descriptive sense, and not for the purposes of limiting the described invention, nor the claims that follow.

That which is claimed:

1. An electricity meter assembly comprising:
    a meter comprising:
        a housing comprising a side wall defining a perimeter of the housing, wherein the side wall at least partially defines a meter cavity of the housing and wherein the side wall defines a base slot;
        at least one electrical component within the meter cavity; and
        a module compartment secured and contained within the meter cavity, wherein the module compartment defines a module cavity comprising a module cavity opening, wherein the module compartment is contained within the housing such that:
            the module compartment is within the meter cavity; and
            the module cavity opening is aligned with the base slot such that the base slot provides access to the module cavity through the side wall; and a module assembly comprising at least one supplemental board configured to supplement the at least one electrical component, wherein the module assembly is removably positioned within the module cavity such that the module assembly is at least partially positionable within the housing and is field-removable, and wherein the module assembly is hot pluggable with the meter.

2. The electricity meter assembly of claim 1, wherein the meter is an ANSI meter.

3. The electricity meter assembly of claim 1, wherein the at least one electrical component comprises at least one of a power supply board, a processing board, a communication board, a base metrology board, or a modular modem.

4. The electricity meter assembly of claim 1, wherein the meter comprises a base assembly comprising the housing.

5. The electricity meter assembly of claim 4, wherein the at least one electrical component comprises a plurality of electrical components within the meter cavity.

6. The electricity meter assembly of claim 4, wherein the meter further comprises a cover assembly comprising a housing, and wherein the housing of the cover assembly forms a seal with the housing of the base assembly such that the meter cavity is sealed.

7. The electricity meter assembly of claim 6, wherein the cover assembly comprises a gasket between the housing of the cover assembly and the housing of the base assembly such that the meter cavity is sealed.

8. The electricity meter assembly of claim 6, wherein the housing of the cover assembly further comprises a cover slot aligned with the base slot and providing access through the housing of the cover assembly to the base slot.

9. The electricity meter assembly of claim 8, wherein the module assembly comprises a module case defining a module case cavity, wherein the at least one supplemental board is removably positioned within the module case cavity, wherein the module case further comprises a case flange, and wherein the case flange is configured to abut portions of the housing of the cover assembly surrounding the cover slot such that the cover slot is sealed.

10. The electricity meter assembly of claim 1, wherein the module compartment comprises a hot pluggable connector in the module compartment, and wherein the module assembly is configured to removably couple to the hot pluggable connector such that the module assembly is communicatively coupled with the meter.

11. The electricity meter assembly of claim 1, wherein the supplemental board comprises a processor board.

12. The electricity meter assembly of claim 11, wherein the processor board comprises at least one of a base metrology board or an advanced metrology board.

13. The electricity meter assembly of claim 1, wherein the supplemental board comprises a power board.

14. The electricity meter assembly of claim 13, wherein the power board comprises a DC power supply.

15. The electricity meter assembly of claim 1, wherein the supplemental board comprises a communications board.

16. The electricity meter assembly of claim 1, wherein the at least one supplemental board comprises a plurality of supplemental boards.

17. The electricity meter assembly of claim 1, wherein the module assembly further comprises a module cover and a module case defining a module case cavity, wherein the supplemental board is within the module case cavity, and wherein the module cover is connected to the module case such that the supplemental board is sealed within the module case cavity.

18. The electricity meter assembly of claim 1, wherein the meter cavity is physically isolated from the module cavity.

19. An electricity meter assembly comprising:
a meter comprising:
 a housing defining a meter cavity;
 at least one electrical component within the meter cavity; and
 a module compartment secured within the meter cavity, wherein the module compartment defines a module cavity, and wherein the module compartment is secured within the meter cavity such that the module compartment is contained within the housing and the meter cavity is physically isolated from the module cavity; and
a module assembly comprising at least one supplemental board configured to supplement the at least one electrical component, wherein the module assembly is removably positioned within the module cavity such that the module assembly is at least partially positionable within the housing and is field-removable, and wherein the module assembly is hot pluggable with the meter.

* * * * *